(12) United States Patent
Zanardi et al.

(10) Patent No.: US 8,296,093 B2
(45) Date of Patent: Oct. 23, 2012

(54) SEMICONDUCTOR DEVICE WITH THERMAL FAULT DETECTION

(75) Inventors: Alberto Zanardi, Villach (AT); Erich Scheikl, Villach (AT); Robert Illing, Villach (AT); Herbert Hopfgartner, Lieserbruecke (AT)

(73) Assignee: Infineon Technologies AG, Neubiberg (DE)

( * ) Notice: Subject to any disclaimer, the term of this patent is extended or adjusted under 35 U.S.C. 154(b) by 381 days.

(21) Appl. No.: 12/649,994

(22) Filed: Dec. 30, 2009

(65) Prior Publication Data

US 2011/0156799 A1 Jun. 30, 2011

(51) Int. Cl.
*G01K 1/08* (2006.01)

(52) U.S. Cl. ........................................ 702/132

(58) Field of Classification Search .................. 702/132, 702/130, 182–185, 188
See application file for complete search history.

(56) References Cited

U.S. PATENT DOCUMENTS

2006/0066384 A1 * 3/2006 Jain et al. .................. 327/378
* cited by examiner

*Primary Examiner* — Edward Raymond
(74) *Attorney, Agent, or Firm* — Slater & Matsil, L.L.P.

(57) ABSTRACT

A semiconductor device includes a semiconductor chip including an active area. A temperature sensor arrangement provides a measurement signal dependent on the temperature in or close to the active area. An evaluation circuit is configured to compare the measurement signal with a first threshold and to signal an over-temperature when the measurement signal exceeds the first threshold. The evaluation circuit is also configured to count the number of exceedances of the first threshold and to signal when a maximum number of exceedances is reached.

23 Claims, 2 Drawing Sheets

SEMICONDUCTOR DEVICE WITH THERMAL FAULT DETECTION

TECHNICAL FIELD

The present invention relates to the field of semiconductor devices and methods for operating such devices, and, in particular embodiments, to power semiconductor devices including a fault detection capability for detecting faulty operating states that lead to a rise in temperature such as, for example, short circuits.

BACKGROUND

Semiconductor devices, especially power semiconductor devices such as power semiconductor switches often include a temperature measurement functionality for detecting faulty or undesired mode of operations during which undesirably high temperatures may occur. Such faulty or undesired mode of operations may be, inter alia, an over-load, or a short circuit.

Power semiconductor switches capable of detecting over-temperature, over-load, short-circuits, etc. are often referred to as "smart power switches." In known applications temperature is often measured at two positions, namely one temperature sensor measures the temperature in or close to the active area of the semiconductor device (e.g., of the DMOS switch) and another sensor measures the temperature in or close to the coldest area of the chip. The difference between these two temperature measures may be used to assess the state of the semiconductor device. That is, if the temperature difference exceeds a predefined threshold value or if one temperature measure exceeds a maximum allowable temperature, then the semiconductor device is powered down in order to avoid damage to the device. The mentioned temperature difference between the active area and a "cold spot" of the chip is also referred to as "relative temperature" and measured in Kelvin.

However, in some applications the mentioned threshold necessary for avoiding damage to the device might be too low compared to high (relative) temperatures resulting from relatively high inrush currents occurring during a start-up period of the device and consequently the over-current shut-down would be triggered indirectly by the unavoidable inrush currents.

Thus, there is still a general need for a semiconductor device including an over-temperature protection, which accounts for high inrush currents after switching on the device.

SUMMARY OF THE INVENTION

A semiconductor device is disclosed. The device includes a semiconductor chip including an active area. A temperature sensor arrangement provides a measurement signal dependent on the temperature in or close to the active area. An evaluation circuit is configured to compare the measurement signal with a first threshold and to signal an over-temperature when the measurement signal exceeds the first threshold. The evaluation circuit is further configured to count the number of exceedances of the first threshold and to signal when a maximum number of exceedances is reached.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
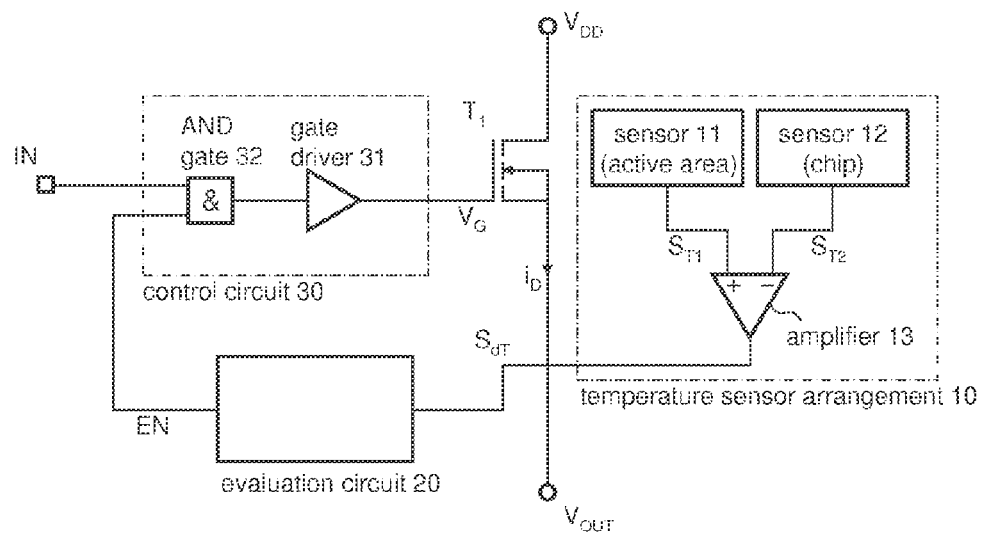
FIG. 1 illustrates a smart power switch by means of a circuit diagram as one example for a semiconductor device according to the invention.

As discussed in the introductory part, high inrush currents may occur after activation of the considered semiconductor device. The semiconductor device may be a, for example, a semiconductor switch controlling the switching state of a lamp. When switching on a cold lamp the inrush currents may be a multiple of the nominal load current. A short time after switching on the lamp the temperature in the active area of the semiconductor switch will rise above a limit (i.e., a pre-defined temperature threshold) which would be unacceptable for a longer period of time since such high temperatures would eventually lead to a thermal destruction of the device.

In most applications as well as in the above-mentioned example (semiconductor switch connected to a lamp) the temperature thresholds are predefined constants and may be fixed for a specific application, i.e., not changeable during operation. The semiconductor device is powered down, for example, when the measured relative temperature exceeds a first threshold of 60 Kelvin. When the considered relative temperature falls below a second threshold (e.g., 50 Kelvin), the semiconductor device is activated again. In case of a high current that leads to an over-temperature such a control mechanism leads to a behavior called "toggling." That is, the device is shut down due to over-temperature. As a result the device cools down and is reactivated, this, again, leads to an overheating of the device and the circle starts over.

The above-mentioned toggling is not always an undesired mode of operation of the semiconductor device. In fact, a semiconductor device operating in the toggling mode may be acceptable for a certain period of time in order to avoid an overdimensioning of the device that would otherwise be necessary. In the above-mentioned example, semiconductor devices are used as smart power switches to control the switching state of loads such as a lamp. When powering on a cold light bulb a quite high inrush current may occur. The semiconductor device is designed such that during (and only during) a start-up period of high inrush current a toggling mode of operation is reached. Such a design, on the one hand, allows for a cheap design and avoids overdimensioned semiconductor switches but, on the other hand, it is not possible to distinguish a start-up period of a "normal" load such as a lamp from a "real" overload such as a short circuit since in both cases over-currents (causing over-temperature) occur at least for a certain time period.

In the above-mentioned case of a smart power switch that controls the switching state of a lamp the over-temperature protection causes the switch to toggle, for example, for about 15 cycles before the transient start up period is over and the load current assumes its nominal value. The nominal current results in relative temperatures below the threshold which triggers the toggling.

If the smart power switch is connected to a short-circuited load instead of a lamp, the short-circuit current will result in an over-temperature as well and thus trigger the over-temperature protection. As a result the power switch will also start to toggle like during the above-mentioned start-up period of the lamp. In contrast to the case with the lamp, the toggling will not stop after a transient start up period. In fact the toggling will continue ad infinitum unless stopped by an "intelligent" short circuit detection as discussed below.

According to one example of the invention the number of toggling cycles is counted and when a maximum number of toggling cycles is reached an automatic reactivation of the semiconductor device is inhibited until the counter is reset. The semiconductor device may, for example, be deactivated when the 32nd toggling cycle occurs until the counter counting the toggling cycles is reset and the temperature is below the predefined threshold. In this example, a start up of a lamp that causes the switch to toggle 15 times as mentioned above will not cause a short circuit detection whereas an actual short circuit is detected after 31 toggling cycles.

It should be noted that the number of toggling cycles given above has to be regarded as examples.

An exemplary circuit implementing the short circuit detection discussed above is illustrated in FIGS. 1 and 2 and extensively described below.

In FIG. 1, one example for a semiconductor device with a short circuit detection is illustrated by means of a circuit diagram. The semiconductor device depicted in FIG. 1 includes a semiconductor switch $T_1$ integrated in a semiconductor chip. The semiconductor chip includes an active area, which is the area that forms the current path between the load electrodes of the semiconductor switch. In other words, the active area is the region where electrical power is dissipated and converted into thermal power, which leads to a rise in temperature during operation of the semiconductor device. The semiconductor switch $T_1$ is depicted as a DMOS transistor. However, any other type of electronic switch could be used.

The semiconductor device further includes a temperature sensor arrangement 10 that provides a measurement signal $S_{dT}$ dependent on the temperature $T_1$ in or close to the active area of the semiconductor chip. The semiconductor device also includes an evaluation circuit 20 that is configured to provide a 1-bit binary output signal EN (i.e., a so-called output "flag" EN) that signals whether an over-temperature or a short circuit has been detected. In the cases of an over-temperature or a short-circuit the output flag EN can be used to deactivate the semiconductor device in order to avoid thermal destruction of the device.

According to one example of the invention the temperature sensor arrangement 10 may include two temperature sensors. A first temperature sensor 11 is arranged such to provide a first temperature signal $S_{T1}$ representative of a temperature $T_1$ present at the active area, whereas a second temperature sensor 12 is arranged such to provide a second temperature signal $S_{T2}$ representative of a chip temperature $T_2$ present remote from the active area of the semiconductor chip. The temperature sensors may be integrated in the same semiconductor chip as the transistor $T_1$ (and thus the active area). However, when using chip-on-chip or chip-by-chip technology one of the temperature sensors 11, 12 as well as other parts of the circuit shown in FIG. 1 may be integrated in one or more separate chips. The temperature sensor arrangement 10 may further include a subtracting unit 13 that is configured to provide a signal representative of a difference dT between the first and the second temperature $T_1$, $T_2$ as the measurement signal $S_{dT}$. In this case the measurement signal $S_{dT}$ can be interpreted as a "relative temperature" with respect to the chip temperature $T_2$ provided by the second temperature sensor 12.

In most cases the first temperature sensor 11 may be integrated in the same semiconductor chip as the transistor $T_1$ and close to the active area. For example, in case of a MOSFET transistor as semiconductor switch $T_1$ a parasitic diode or bipolar transistor, which may be present due to specifics of the production process, may be used as a temperature sensor. However, the temperature coefficient of silicon may also be used for temperature measurement. The second temperature sensor 12 is arranged such to measure an average chip temperature. It has, therefore, to be arranged remote from the active region close to the coldest part of the chip. This sensor 12 may also be integrated in a separate chip as mentioned above.

In order to protect the semiconductor device and other devices connected thereto from damage a control circuit 30 may be provided that is configured to deactivate and/or to power down the semiconductor device in case the evaluation circuit 20 assesses the measurement signal $S_{dT}$ as "abnormal" and thus signals a faulty state of operation (i.e., an over-temperature or a short circuit) to the control circuit 30 by using the output flag EN. In the present example, where the considered semiconductor device is a smart power switch, the control circuit 30 may include a gate driver 31 for generating a driver signal $V_G$ provided to a control electrode (e.g., a gate electrode) of the semiconductor switch. The driver signal $V_G$ is set in accordance with an input signal IN provided to the control circuit 30 and thus to the gate driver 31. To ensure the above-mentioned deactivate or power-down function a gate circuit 32 may be used to blank the input signal IN thus forcing the gate driver 31 to generate a driver signal $V_G$ that causes a switch-off of the transistor $T_1$. In the present example, the input signal IN is blanked in response to an enable signal EN having the logic value "0" which signals an over-temperature or a short-circuit. The enable signal EN may be provided by the evaluation circuit 20 (see FIG. 2).

Figure 2:
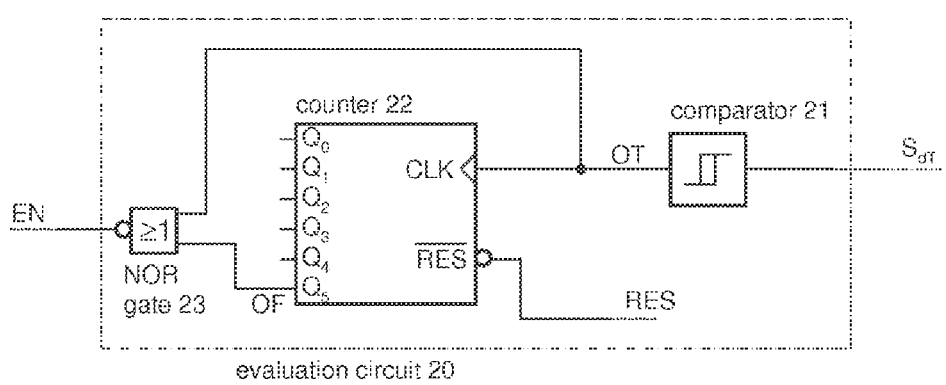
FIG. 2 illustrates one example of the evaluation circuit of FIG. 1 according to one example of the invention.

In FIG. 2 the evaluation circuit 20 of FIG. 1 is illustrated in more detail. FIG. 2 also shows the details of the above-mentioned short-circuit detection. According to the illustrated example of the invention, the evaluation circuit 20 is configured to compare the measurement signal $S_{dT}$ with a first threshold and to signal an over-temperature when the measurement signal $S_{dT}$ exceeds the first threshold. The evaluation circuit 20 is further configured to count the number of exceedances of the first threshold and to signal when a maximum number of exceedances is reached. Each exceedances of the first threshold indicates a new toggling cycle. If the maximum number of exceedances of the first threshold (i.e., the maximum number of toggling cycles) is reached the semiconductor device is assessed as short-circuited. For accomplishing the above-mentioned comparison the evaluation circuit 20 may include a comparator 21 with hysteresis, i.e., the comparator 21 may have a first and a second threshold. Thus an over-temperature signal OT is set when the measurement signal $S_{dT}$ rises above the first threshold thus signalling an over-temperature. To avoid an immediate reset of the over-temperature signal, the over-temperature signal OT is not reset before the measurement signal $S_{dT}$ falls below a second threshold, which is lower than the first threshold. In other words, if the relative temperature dT of the active area exceeds a predefined limit (represented by the first threshold) an over-temperature is signalled using the over-temperature signal OT which is an 1-bit binary signal and thus can also be seen as an over-temperature flag.

For accomplishing the above-mentioned counting of exceedances of the first threshold or, in other words, for accomplishing the counting of the toggling cycles of the comparator 21 the evaluation circuit may include a counter 22 receiving the over-temperature signal provided by the comparator 21 at its clock input CLK. In the present example the counter 22 is a simple 6 bit counter having a counter register that is incremented (starting from zero after a reset) each time a rising edge occurs at the clock input CLK, that is each time an over-temperature is signalled by the comparator. The 6 bit counter output signal $Q=(Q_0, Q_1, \ldots, Q_5)$ represents the current state of the counter register. The five least significant bits $Q_0$ to $Q_4$ of the counter output signal are not connected whereas the most significant bit $Q_5$ of the counter output signal is used as an overflow signal OF (also referred to as overflow flag). Thus, the counter can, starting from zero, count 31 exceedances of the first threshold before the overflow flag OF is set. When counting the 32nd exceedance of the first threshold by the measurement signal, then the most significant bit of the counter output (which is used as overflow flag OF) is set from 0 to 1 thus signalling a counter overflow due to a persistent toggling of the comparator 21, which is interpreted as a short circuit.

By using a flag (a single bit binary output signal) the task of signalling when a maximum number of exceedances is reached can efficiently be implemented. However, there are many other options to implements such a functionality in digital electronics. The desired function of the circuit illustrated in FIG. 2 could, for example, be implemented by using discrete digital electronic components (such as counters, comparators, gates, etc.) and as well by using, additionally or alternatively, microprocessors together with an appropriate software.

In the circuit of FIG. 2 an over-temperature is signalled by the over-temperature signal OT (over-temperature flag) and the event that the maximum number of toggling cycles has been reached is signalled by the overflow signal OF (counter overflow flag). These two signals may be combined, for example, by a NOR-gate 23, which provides an enable signal EN at its output. This enable signal EN assumes a logic "1" (EN=1) if the over-temperature signal OT signals "no over-temperature" (OT=0) and the overflow signal OF signals "no overflow" (OF=0). As soon as one of the signals OT and OF signals over-temperature (OT=1) or, respectively, a counter overflow (OF=1), then the enable signal EN assumes a low level (EN=0).

The signal EN may be used to deactivate the semiconductor device in order to prevent a thermal destruction of the device.

Once a counter overflow OF has occurred the enable signal EN will remain "0" until the counter 22 is reset. There are many application-depending strategies concerning the issue of when the counter is to be reset after an overflow has occurred (i.e., after the detection of a short circuit). In the example of FIG. 2 the counter is reset in response to a low level of the signal RES. The respective input of the counter 22 is, therefore, labelled as "NOT RES." In a simple application the input signal IN (see FIG. 1) may be also supplied to the evaluation circuit 20 and used as reset signal RES. In this case the counter is reset each time the input signal IN assumes a low level and thus externally deactivates the semiconductor device. In this example the counter register is zero each time the input signal IN goes to a high level in order to activate the semiconductor device. According to another example the logic state of the over-temperature signal OT and/or the overflow signal OF may be polled by an external controller (not shown) via an SPI bus (abbr. for serial peripheral interface bus) which is supported by many standard micro-controllers. In such an example the reset signal RES may be generated in response to a respective command received from the SPI bus sent by the controller.

Figure 3:
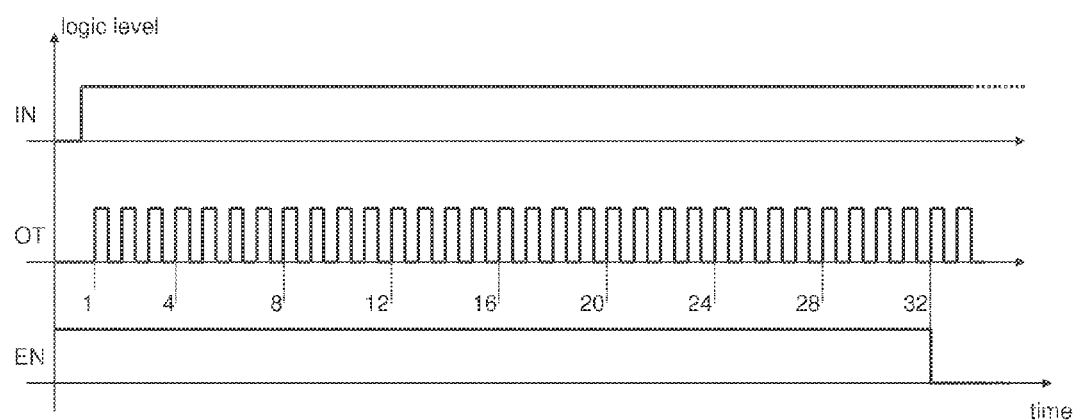
FIG. 3 illustrates, by means of timing diagrams, the function of the evaluation circuit of FIGS. 1 and 2.

FIG. 3 illustrates by means of timing diagrams the behavior of the evaluation circuit 20 as illustrated in FIGS. 1 and 2 in the case of a short-circuited semiconductor device. The semiconductor device is activated in response to an appropriate logic level of an input signal IN (see FIG. 1). In the example of a smart power switch integrated in DMOS technology the gate of the DMOS switch is charged in order to enable the flow of the load current through a short-circuited load. Due to the short circuit, the load current as well as the relative temperature of the active area of the semiconductor device starts to rise immediately after the activation of the semiconductor device. The temperature (represented by the measurement signal $S_{dT}$) quickly exceeds the first threshold and the evaluation circuit 20 generates a corresponding over-temperature signal (OT=1), increments the register value of the counter 22, and sets the enable signal EN to a low level (EN=0). As a result the semiconductor device is deactivated, the load current flow is stopped, and the relative temperature of the active area falls below the second threshold. In response to this the evaluation circuit 20 generates a corresponding over-temperature signal (OT=0) and sets the enable signal EN to a high level (EN=1); thus the semiconductor device is activated again and the cycle starts over, the register value of the counter 22 being incremented each cycle.

When the measurement signal $S_{dT}$ exceeds the first threshold and thus the over-temperature signal OT is set to "1" for the 32nd time (i.e., maximum number of exceedances is 32 in the present example), then the counter overflow signal OF is set to "1" and, as a result, the enable signal EN is set to "0" independently of the temperature until the counter 22 is reset to zero. The overflow signal OF is regarded as an indicator for the short circuit and as a response to the overflow signal OF the semiconductor may be unconditionally deactivated by the control circuit 30 (see FIG. 1) in order to avoid any damage to the device or other components connected thereto.

To tasks performed by the evaluation circuit 20 may be summarized as follows:

(1) resetting the counter 22 in response to a reset signal RES;

(2) receiving the measurement signal $S_{dT}$;

(3) comparing the measurement signal $S_{dT}$ with a first threshold that is representative of a temperature limit;

(4) signalling (by a rising edge in the signal OT in the present example) when the first threshold is exceeded;

(5) incrementing the counter 22 in response to the detection of an exceedances of the first threshold;

(6) signalling (by a rising edge in the signal OF in the present example) when a maximum number of exceedances of the first threshold have been detected thus signalling a short-circuit.

In order to deactivate the semiconductor chip in response to an over-temperature or a short circuit the following tasks are performed:

(7) setting an enable signal EN to a first logic level indicating a faulty state of the semiconductor device in response to a detected over-temperature or when the maximum number of exceedances of the first threshold have been detected and providing the enable signal EN to a controll circuit 30;

(8) signalling (by a falling edge in the signal OT in the present example) when the measurement signal falls below a second threshold;

(9) resetting the enable signal EN to second logic level indicating a fault-free state of the semiconductor device if no over-temperature is detected or if the maximum number of exceedances of the first threshold has not (yet) been reached.

Although various examples to realize the invention have been disclosed, it will be apparent to those skilled in the art that various changes and modifications can be made that will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. A semiconductor device comprising:
   a semiconductor chip including an active area;
   a temperature sensor arrangement that provides a measurement signal dependent on a temperature in or close to the active area; and
   an evaluation circuit that is configured to;
      compare the measurement signal with a first threshold and to signal an over-temperature when the measurement signal crosses the first threshold in a first direction,
      count a number of times the measurement signal crosses the first threshold in the first direction, and
      provide a signal indicating that the measurement signal has crossed the first threshold in the first direction a predefined maximum number of times.

2. The semiconductor device of claim 1, wherein the evaluation circuit comprises a comparator which is configured
   to set an over-temperature signal when the measurement signal rises above crosses the first threshold in the first direction thus signalling an over-temperature; and
   To reset the over-temperature signal when the measurement signal crosses a second threshold in a second direction opposite the first direction.

3. The semiconductor device of claim 2, wherein the evaluation circuit comprises a counter receiving the over-temperature signal and configured to count number of transitions from a reset-state to a set-state in the over-temperature signal.

4. The semiconductor device of claim 3, wherein the counter is further configured
   to set an overflow signal when a counter value reaches a predefined maximum value; and
   to reset the overflow signal in response to a reset signal.

5. The semiconductor device of claim 4, wherein the evaluation circuit further comprises a gate circuit receiving the over-temperature signal and the overflow signal and providing an enable/disable signal indicating, by a respective logic level, an over-temperature and/or an overflow of the counter.

6. The semiconductor device of claim 1, further comprising a control circuit that is configured to deactivate and/or to power down the semiconductor device when the evaluation circuit signals an over-temperature and/or when the evaluation circuit signals that the measurement signal has crossed the first threshold in the first direction the predefined maximum number of times.

7. The semiconductor device of claim 6, wherein the control circuit is configured to deactivate and/or to power down the semiconductor device when the evaluation circuit signals an over-temperature.

8. The semiconductor device of claim 6, wherein the control circuit is configured to deactivate and/or to power down the semiconductor device when the evaluation circuit signals that the measurement signal has crossed the first threshold in the first direction the predefined maximum number of times.

9. The semiconductor device of claim 6, wherein the control circuit is configured to deactivate and/or to power down the semiconductor device when the evaluation circuit signals an over-temperature and when the evaluation circuit signals that the measurement signal has crossed the first threshold in the first direction the predefined maximum number of times.

10. The semiconductor device of claim 1, wherein the semiconductor device comprises a semiconductor switch having a load current path forming the active area of the semiconductor chip.

11. The semiconductor device of claim 10, further comprising a control circuit that is configured to generate a driver signal for setting the switching state of the semiconductor switch in accordance with an input signal.

12. The semiconductor device of claim 7, wherein the control circuit is configured to blank an input signal of a semiconductor switch, thus inhibiting an activation of the semiconductor switch in response to an over-temperature signal and/or when measurement signal has crossed the first threshold in the first direction the predefined maximum number of times.

13. A method for operating a semiconductor device comprising a semiconductor chip including an active area, the method comprising:
   providing a measurement signal dependent on a temperature in or close to the active area;
   comparing the measurement signal with a first threshold;
   signalling an over-temperature when the measurement signal the first threshold in a first direction; and
   counting a number of times the measurement signal crosses the first threshold in the first direction; and
   signalling when the measurement signal crosses the first threshold in the first direction a predefined maximum number of times.

14. The method of claim 13, wherein providing the measurement signal comprises:
   measuring a first temperature representative of a temperature present at the active area;
   measuring a chip temperature remote from the active area of the semiconductor chip; and
   providing a signal representative of a difference between the first temperature and the chip temperature as the measurement signal.

15. The method of claim 13, wherein signalling an over-temperature comprises:
   setting an over-temperature signal when the measurement signal crosses the first threshold in the first direction, thus signalling over-temperature; and
   resetting the over-temperature signal when the measurement signal crosses a second threshold in a second direction opposite the first direction.

16. The method of claim 15, further comprising:
   combining the over-temperature signal and an overflow signal indicating that the measurement signal has crossed the first threshold in the first direction the predefined maximum number of times.

17. The method of claim 13, further comprising deactivating and/or powering down the semiconductor device in response to an enable/disable signal indicating that either an over-temperature or that the measurement signal has crossed the first threshold in the first direction the predefined maximum number of times.

18. The method of claim 13, further comprising deactivating and/or powering down the semiconductor device in response to an enable/disable signal indicating that an over-temperature is reached.

19. The method of claim 13, further comprising deactivating and/or powering down the semiconductor device in response to an enable/disable signal indicating that the measurement signal has crossed the first threshold in the first direction the predefined maximum number of times.

20. The method of claim 13, further comprising deactivating and/or powering down the semiconductor device in response to an enable/disable signal indicating that both an over-temperature and that measurement signal has crossed the first threshold in the first direction the predefined maximum number of times.

21. A method of operating a semiconductor switch, the method comprising:
    enabling the semiconductor switch;
    operating the semiconductor switch in a toggle mode after activating the switch, operating the semiconductor switch in the toggle mode comprising
        deactivating the semiconductor switch when a temperature of the semiconductor exceeds a first temperature threshold, and
        re-activating the semiconductor switch when a temperature of the semiconductor switch falls below a second threshold;
    counting a number of times the temperature of the semiconductor switch transitions from below the first threshold to above the first threshold while in the toggle mode; and
    determining when the counted number of times exceeds a predefined number of times.

22. The method of claim 21, further comprising:
    exiting the toggle mode when the counted number of times exceeds a predefined number of times based on the determining, exiting the toggle mode comprising disabling the switch.

23. The method of claim 21, wherein the predefined number of times is 32.

* * * * *

UNITED STATES PATENT AND TRADEMARK OFFICE
CERTIFICATE OF CORRECTION

PATENT NO. : 8,296,093 B2  
APPLICATION NO. : 12/649994  
DATED : October 23, 2012  
INVENTOR(S) : Alberto Zanardi Page 1 of 1

It is certified that error appears in the above-identified patent and that said Letters Patent is hereby corrected as shown below:

In the Claims:

In Col. 7, line 27, claim 2, delete "rises above".

Signed and Sealed this  
Sixth Day of May, 2014

Michelle K. Lee  
*Deputy Director of the United States Patent and Trademark Office*